(12) United States Patent
Fujita et al.

(10) Patent No.: US 8,842,708 B2
(45) Date of Patent: Sep. 23, 2014

(54) LIGHT OSCILLATION DEVICE AND RECORDING DEVICE

(75) Inventors: Goro Fujita, Kanagawa (JP); Takao Miyajima, Kanagawa (JP); Hideki Watanabe, Kanagawa (JP)

(73) Assignee: Sony Corporation, Tokyo (JP)

( * ) Notice: Subject to any disclaimer, the term of this patent is extended or adjusted under 35 U.S.C. 154(b) by 314 days.

(21) Appl. No.: 13/052,547

(22) Filed: Mar. 21, 2011

(65) Prior Publication Data

US 2011/0234744 A1 Sep. 29, 2011

(30) Foreign Application Priority Data

Mar. 25, 2010 (JP) ................ P2010-070924

(51) Int. Cl.
| | | |
|---|---|---|
| B41J 2/385 | (2006.01) | |
| B41J 2/47 | (2006.01) | |
| B41J 2/00 | (2006.01) | |
| H01S 5/00 | (2006.01) | |
| H01S 5/06 | (2006.01) | |
| H01S 5/343 | (2006.01) | |
| G11B 7/1263 | (2012.01) | |
| B82Y 20/00 | (2011.01) | |
| H01S 5/065 | (2006.01) | |
| H01S 5/0625 | (2006.01) | |
| H01S 5/22 | (2006.01) | |

(52) U.S. Cl.
CPC ............. *G11B 7/1263* (2013.01); *H01S 5/0658* (2013.01); *H01S 5/0014* (2013.01); *H01S 5/06255* (2013.01); *H01S 5/0601* (2013.01); *H01S 5/34333* (2013.01); *B82Y 20/00* (2013.01); *H01S 5/22* (2013.01)
USPC ...... 372/45.013; 347/130; 347/225; 347/110; 372/45.012

(58) Field of Classification Search
CPC ................ B41J 2/385; B41J 2/47; B41J 2/00; H01S 5/00
USPC .......................................... 347/130, 225, 110
See application file for complete search history.

(56) References Cited

U.S. PATENT DOCUMENTS

| 6,542,522 | B1 * | 4/2003 | Arahira ........................... 372/18 |
|---|---|---|---|
| 2002/0054617 | A1 * | 5/2002 | Tsuda et al. .................... 372/46 |

(Continued)

FOREIGN PATENT DOCUMENTS

| EP | 1553573 A1 | 7/2005 |
|---|---|---|
| EP | 1583088 A2 | 10/2005 |
| WO | 2006137303 A1 | 12/2006 |

OTHER PUBLICATIONS

EP Search Report corresponding to 11156642.8 dated Jun. 9, 2011; 7 pages.

(Continued)

*Primary Examiner* — Justin Seo
*Assistant Examiner* — Kendrick Liu
(74) *Attorney, Agent, or Firm* — K&L Gates LLP

(57) ABSTRACT

A light oscillation device has a self oscillation semiconductor laser that has a double quantum well separated confinement heterostructure made of GaInN/GaN/AlGaN materials and that includes a saturable absorber section which is applied with a negative bias voltage and a gain section into which a gain current is injected, a light separation unit that separates a portion of laser light beams from the self oscillation semiconductor laser, a light sensing element that senses the laser light beams separated by the light separation unit, and a current control circuit which controls a current injected into the gain section of the self oscillation semiconductor laser based on an amount of the laser light beams which are sensed by the light sensing element.

10 Claims, 11 Drawing Sheets

(56) References Cited

U.S. PATENT DOCUMENTS

| | | |
|---|---|---|
| 2004/0062164 A1 | 4/2004 | Miyamoto et al. |
| 2004/0099870 A1* | 5/2004 | Ono et al. ............... 257/79 |
| 2010/0020838 A1* | 1/2010 | Oota et al. ............ 372/45.013 |
| 2010/0142336 A1 | 6/2010 | Ishibashi et al. |

OTHER PUBLICATIONS

"Picosecond optical pulse generation from self-pulsating bisectional GaN-based blue-violet laser diodes", Takao Miyajima et al.; Applied Physics Letters, vol. 94, No. 16, 1103, Apr. 20, 2009, XP002638947, DOI: 10.1063/1.3106055.

* cited by examiner

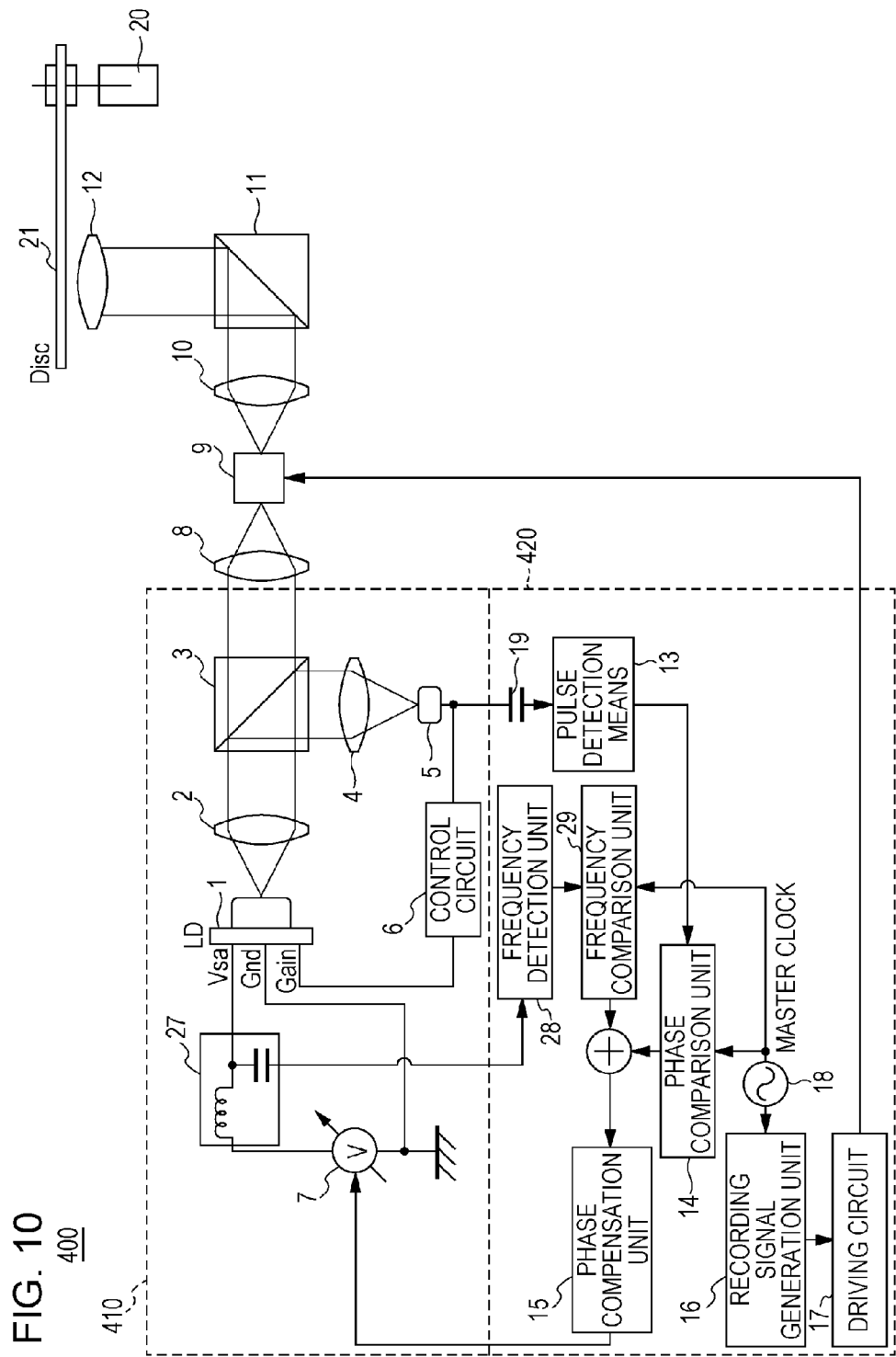

LIGHT OSCILLATION DEVICE AND RECORDING DEVICE

CROSS REFERENCES TO RELATED APPLICATIONS

The present application claims priority to Japanese Priority Patent Application JP 2010-070924 filed in the Japan Patent Office on Mar. 25, 2010, the entire contents of which are hereby incorporated by reference.

BACKGROUND

The present application relates to a light oscillation device emitting laser light and a recording device using the light oscillation device.

In recent years, with the advance of IT in society, there is a further demand for high capacity and high speed. For this reason, as media for delivery of information, like wireless communication, optical communication using not only electromagnetic waves in, for example, a 2.4 GHz band or a 5 GHz band but also light in, for example, a 1.5 µm band (to several hundreds of THz range) has been rapidly disseminated.

In addition, since the delivery of information using light is applied to optical communication using, for example, optical fiber and further to recording and reproducing information to and from a recording medium, the optical information technique is an important base for supporting the progress of the information society in the future.

A light source which oscillates specific pulses is used to deliver and record information using light. Particularly, for the high capacity and high speed of the communication, the recording, and the reproduction, light sources with high output and short pulses are necessary, and, as light sources which satisfy them, various kinds of semiconductor lasers have been studied and developed.

For example, when a recording device of an optical disc performs reproduction during use of a single mode laser, noises occur due to interference of an optical system, and an oscillation wavelength and an output vary or noises occur due to variation in temperature.

For this reason, a method has been performed in which a laser has multiple modes through modulation using an external high frequency module, and the output variation due to the variation in temperature or light returning to the optical disc is suppressed. However, in this method, a device becomes large and costs increase with the addition of the high frequency module.

In contrast, a self oscillation semiconductor laser flashes at high frequency and directly oscillates in the multimode, it is possible to suppress the output variation without the high frequency module.

For example, the present inventors implement a light source capable of realizing the pulse width of 30 ps and the oscillation output of 2.4 W at the frequency of 0.9 GHz using a self oscillating GaN blue-violet semiconductor laser (refer to Takao Miyajima, Hideki Watanabe, Masao Ikeda and Hiroyuki Yokoyama, Applied Physics Letters 94, 161103 (2009)).

This semiconductor laser is a BS (bisectional) type self oscillation semiconductor laser which includes a gain section and a saturable absorber section.

In the semiconductor laser, a reverse bias voltage is applied to the saturable absorber section. At this time, a current is injected into the gain section, and thereby laser light having, for example, the wavelength of 407 nm is emitted.

SUMMARY

It is expected that such a light source with high output and short pulse width may be applied to various fields, such as, for example, a light source used to perform recording on a two-photon absorption recording medium, nonlinear optical bio-imaging, micro machining, or the like.

In addition, recently, for the high speed of signal transmission, an optical circuit has been proposed in which silicon electronic devices are connected to each other by an optical interconnection, and the signal transmission is performed using light. In the future, an optical oscillator is necessary as a master clock of an electronic circuit in order to perform an operation process using the optical circuit.

In a case of using the self oscillating laser as a light oscillator, a laser having a specific frequency is prepared according to its use.

For example, in a recording and reproducing device, it is necessary for the light source to emit a recording signal synchronized with a wobble signal read from an optical recording medium or a rotation synchronization signal from a spindle motor which rotates the optical recording medium.

However, the self oscillating laser typically is set to a unique pulsed light frequency depending on its structure. Thereby, since it is necessary for a laser to be manufactured for each use, the laser is manufactured with very high precision. Therefore, the costs increase.

In addition, in a light source, since, for example, the pulsed light frequency varies due to external factors such as temperature, high stability is necessary.

When the self oscillation semiconductor laser or a mode synchronization semiconductor laser is used as a light source, pulsed light is continuously oscillated, and thus an optical signal carrying a recording signal is formed by passing the pulsed light through an optical switch.

For example, it is assumed that, in synchronization with master clocks, shown in FIG. 11A, extracted from a wobble signal or the like, the optical switch is turned on during the period shown in FIG. 11B, and an optical signal carrying recording data corresponding to 6T recording is output.

As shown in FIG. 11C, if the emitted pulsed light is synchronized with the master clocks in FIG. 11A, the pulse signals corresponding to 6T recording as shown in FIG. 11D are generated through the optical switch.

However, as shown in FIG. 11E, if the emitted pulsed light is not synchronized with the master clocks shown in FIG. 11A, the pluses passing through the optical switch become the signals corresponding to 5T recording as shown in FIG. 11F. For this reason, accurate signals may not be generated.

In addition, in a case where continuous light is oscillated as a pulse through external modulation, it is possible to fundamentally modulate the pulsed light frequency by using an element capable of performing high speed modulation such as, for example, an EA (electro-absorption) modulator. However, there is a problem in that the use of the external modulator also causes the costs to increase, and, the on and off switching ratio of pulses is reduced in the case of the EA modulator.

It is desirable to provide a light oscillation device and a recording device, enabling a desired pulsed light frequency to be obtained with a simple configuration.

A light oscillation device according to an embodiment has a self oscillation semiconductor laser that has a double quantum well separated confinement heterostructure made of GaInN/GaN/AlGaN materials and that includes a saturable absorber section which is applied with a negative bias voltage and a gain section into which a gain current is injected.

The light oscillation device according to an embodiment includes a light separation means for separating a portion of laser light beams from the self oscillation semiconductor laser, and a light sensing element that senses the laser light beams separated by the light separation means.

The light oscillation device according to an embodiment includes a current control circuit which controls a current injected into the gain section of the self oscillation semiconductor laser based on an amount of the laser light beams which are sensed by the light sensing element.

In the light oscillation device according to an embodiment, as a light source, there is used the self oscillation semiconductor laser that has a double quantum well separated confinement heterostructure made of GaInN/GaN/AlGaN materials and that includes a saturable absorber section which is applied with a negative bias voltage and a gain section into which a gain current is injected.

For this reason, it is possible to change the pulsed light frequency of the oscillated laser light through the voltage applied to the saturable absorber section.

According to an embodiment, there is provided a recording device including the above-described light oscillation device, a light modulation means for modulating the laser light emitted from the light oscillation device, and an object lens that collects the laser light modulated by the light modulation means on a recording medium.

The recording device according to an embodiment includes a reference signal generation unit that generates master clock signals, a recording signal generation unit that generates recording signals based on the master clock signals, and a driving circuit that drives the light modulation means based on the recording signals.

The recording device according to an embodiment includes a pulse detection means for detecting pulsed light of the laser light sensed by the light sensing element, and a phase comparison means for detecting a phase difference between the pulsed light and the master clock signals.

The recording device according to an embodiment includes a compensation means for controlling a voltage applied to the saturable absorber section of the self oscillation semiconductor laser based on the phase difference detected by the phase detection unit.

In the recording device according to an embodiment of the embodiment, the phase difference between the pulsed light of the laser light generated from the light oscillation device and the master clock signals is detected. The voltage applied to the saturable absorber section of the self oscillation semiconductor laser is controlled based on the phase difference.

For this reason, it is possible to synchronize the pulsed light frequency of the laser light generated from the light oscillation device with the master clock signals.

A recording device according to another embodiment includes a current detection unit connected to the saturable absorber section of the self oscillation semiconductor laser, and a light modulation means for modulating laser light emitted from a light oscillation device.

The recording device according to another embodiment includes an object lens that collects the laser light modulated by the light modulation means on a recording medium;

a reference signal generation unit that generates master clock signals, and a recording signal generation unit that generates recording signals based on the master clock signals.

The recording device according to another embodiment includes a driving circuit that drives the light modulation means based on the recording signals, and a frequency detection means for detecting a frequency of the signal detected by the current detection unit.

The recording device according to another embodiment includes a frequency comparison means for detecting a frequency difference between the frequency detected by the frequency detection means and a frequency of the master clock signals.

The recording device according to another embodiment includes a compensation means for controlling a voltage applied to the saturable absorber section of the self oscillation semiconductor laser based on the frequency difference detected by the frequency comparison means.

In the recording device according to another embodiment, the current detection unit connected to the saturable absorber section detects the pulsed light frequency of the self oscillation semiconductor laser. For this reason, it is possible to accurately detect even pulsed light with a very high frequency.

Also, in this recording device, the bias voltage applied to the saturable absorber section of the self oscillation semiconductor laser is controlled based on a frequency difference or a phase difference between the detected pulsed light frequency and the master clock signals, or both of them. For this reason, it is possible to synchronize the pulsed light frequency of the laser light generated from the light oscillation device with the master clock signals.

In the light oscillation device according to an embodiment, a pulsed light frequency of oscillated laser light can vary due to a voltage applied to the saturable absorber section. Therefore, it is possible to provide a light oscillation device which can freely change and easily control the pulsed light frequency of the oscillated laser light.

In the recording device according to an embodiment, it is possible to synchronize a pulsed light frequency of laser light generated from a light oscillation device with master clock signals. Therefore, it is possible to perform more accurate recording by using the recording device according to an embodiment.

Also, in the recording device according to another embodiment, it is possible to synchronize even laser light having a very high pulsed light frequency with master clock signals. Therefore, in the recording device according to another embodiment, it is possible to accurately realize high density and high speed recording.

Additional features and advantages are described herein, and will be apparent from the following Detailed Description and the figures.

BRIEF DESCRIPTION OF THE FIGURES

FIGS. 7A to 7C show waveforms of laser light and the like, wherein FIG. 7A shows a waveform of laser light emitted from the self oscillation semiconductor laser, FIG. 7B shows a waveform of a modulation signal used to drive a light modulation unit, or of a recording signal, and FIG. 7C shows a waveform of laser light passing through the light modulation unit.

FIG. 10 is a schematic configuration diagram illustrating a recording device according to a fourth embodiment.

FIGS. 11A to 11F are diagrams illustrating synchronization between master clocks and light pulses, wherein FIG. 11A shows master clocks; FIG. 11B shows recording data corresponding to 6T; FIG. 11C shows pulses emitted from a laser; FIG. 11D shows a pulse state after the pulses shown in C pass through the switch in B; FIG. 11E shows pulses emitted from a laser; and FIG. 11F shows pulse state after the pulses shown in E pass through the switch in B.

DETAILED DESCRIPTION

Embodiments of the present application will be described below in detail with reference to the drawings.

1. First Embodiment (a light oscillation device)
2. Second Embodiment (a first example of applying the light oscillation device to a recording device)
3. Third Embodiment (a second example of applying the light oscillation device to a recording device)
4. Fourth Embodiment (a third example of applying the light oscillation device to a recording device)

1. First Embodiment

Figure 1:
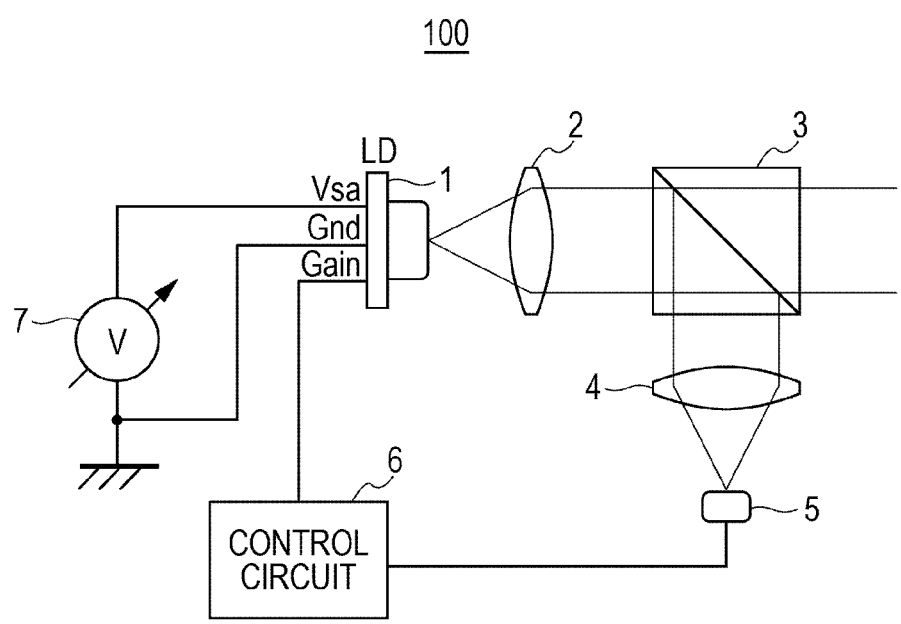
FIG. 1 is a schematic configuration diagram illustrating a light oscillation device according to a first embodiment.
Figure 2A:
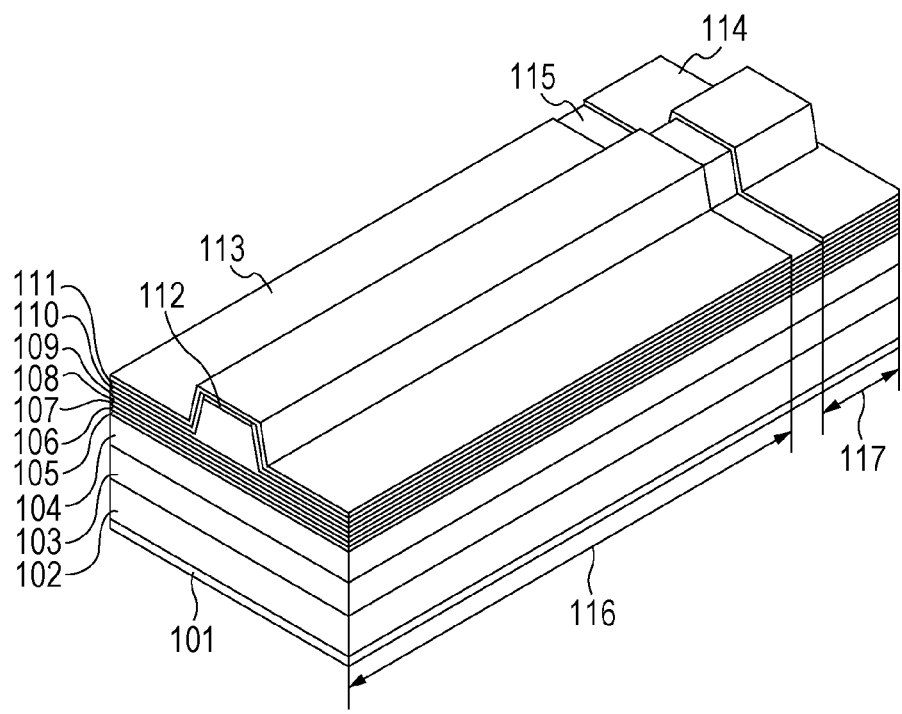
FIG. 2A is a schematic diagram illustrating a configuration of a self oscillation semiconductor laser.

FIG. 1 is a schematic configuration diagram illustrating a light oscillation device according to a first embodiment. The light oscillation device 100 according to this embodiment is provided with a collimating lens 2 which collimates the light from a self-oscillation semiconductor laser 1, a light separating unit 3, a collecting lens, a light sensing element 5, a current control circuit 6, and a variable voltage source 7 which applies a reverse bias voltage to the self-oscillation semiconductor laser 1. The structure of this self-oscillation semiconductor laser 1 is shown in FIG. 2. As shown in FIG. 2A, the self-oscillation semiconductor laser 1 is constituted by the gain section 116 and the saturable absorber section 117. A double quantum well separated confinement heterostructure made of GaInN/GaN/AlGaN materials is formed on the (0001) surface of an n type GaN substrate 102.

On the substrate 102 are formed n type GaN layer 103, n type AlGaN clad layer 104, n type GaN guide layer 105, double quantum well active layer 106, p type GaInN guide layer 107, p type AlGaN clad layer 108, and p type AlGaN barrier layer 109. A gain current is injected into the gain section 116. A double quantum well separated confinement heterostructure made of GaInN/GaN/AlGaN materials is formed on the (0001) surface of an n type GaN substrate 102.

This heterostructure may be formed by, for example, an MOCVD (Metal Organic Chemical Vapor Deposition) method.

A ridge structure is formed in the center portion of a p type GaN/AlGaN superlattice clad layer 110 as shown in FIG. 2A, and a p type GaN layer 112 is formed on the ridge. In addition, an $SiO_2$/Si insulating layer 111 is formed in the lateral side of the ridge, or on the parts where the ridge is not formed on the p type GaN/AlGaN superlattice clad layer 110.

On the p type GaN layer 112 and the $SiO_2$/Si insulating layer 111, p type electrodes 113 and 114 are formed by ohmic contact.

In other words, the main electrode 113 is formed on the gain section 116, and the subsidiary electrode 114 is formed on the saturable absorber section 117. The electrodes are separated by a separation section 115 which is, for example, 20 μm wide and has a groove shape, and thus are electrically insulated from each other. The lengths of the main electrode 113 and the subsidiary electrode 114 are respectively, for example, 520 μm, and 60 μm.

In addition, an n type lower electrode 101 is formed by ohmic contact on the lower surface of an n type GaN substrate 102.

A front opening wall surface of the gain section 116 is coated with an anti-reflection layer having the reflectance of 10%, and a rear opening wall surface of the saturable absorber section 117 is coated with a high reflection film having the reflectance of 95%.

Figure 2B:
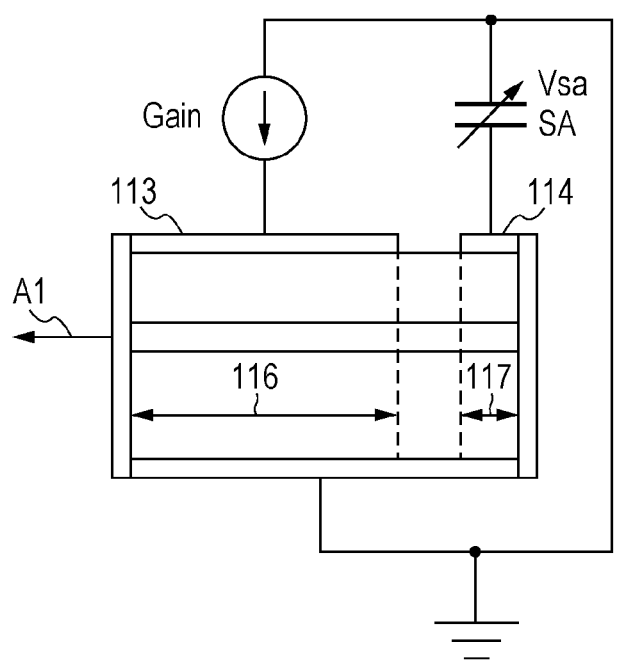
FIG. 2B is a schematic diagram illustrating a form where laser light is emitted from the self oscillation semiconductor laser.

As shown in FIG. 2B, the subsidiary electrode 114 applies a reverse bias voltage to the saturable absorber section 117 in the self oscillation semiconductor laser 1. At this time, when a current is injected to the gain section 116 from the main electrode 113, laser light is emitted in the direction marked with the arrow A1.

The present inventors have found that the pulsed light frequency of the laser light can be controlled by changing the bias voltage applied to the saturable absorber section 117 in the self oscillation semiconductor laser 1.

Figure 3A:
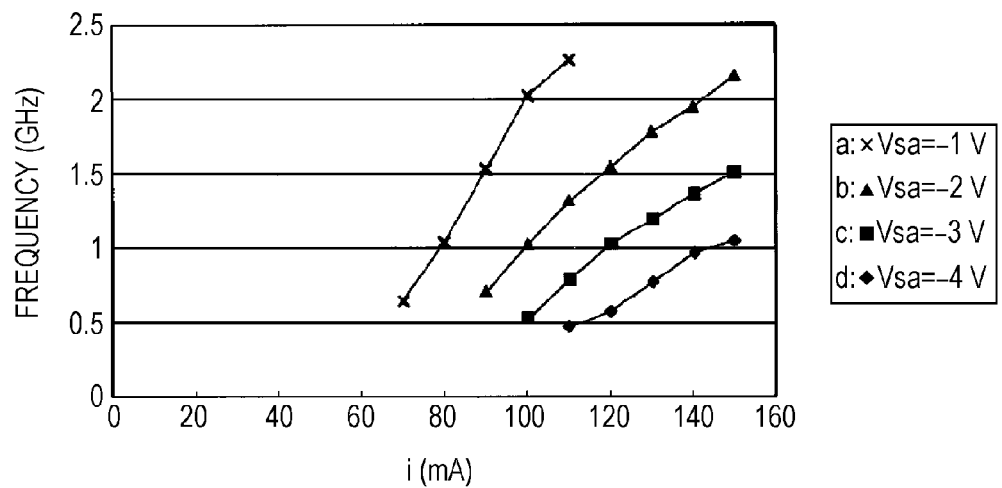
FIG. 3A is a graph illustrating a relationship between a gain current of the self oscillation semiconductor laser and a pulsed light frequency of oscillated laser light.

FIG. 3A is a graph illustrating the pulsed light frequency of the laser light oscillated when a current injected into the gain section 116 varies at a constant bias voltage with respect to the saturable absorber section 117. The transverse axis expresses a current amount i (mA) to be injected into the gain section 116, and the longitudinal axis expresses the pulsed light frequency Frequency (GHz) of the oscillated laser light.

In addition, the symbol a denotes a case where the bias voltage is −1V, and the symbol b denotes a case where the bias voltage is −2V. Also, the symbol c denotes a case where the bias voltage is −3V, and the symbol d denotes a case where the bias voltage is −4V.

It can be seen from FIG. 3A that as the current amount to be injected into the gain section 116 increases, the pulsed light frequency of the laser light also increases. Further, if a current is constant, the pulsed light frequency of the laser light varies according to the variation in the bias voltage, and it can be seen that as the value of the bias voltage increases in a negative direction, the pulsed light frequency decreases.

Figure 3B:
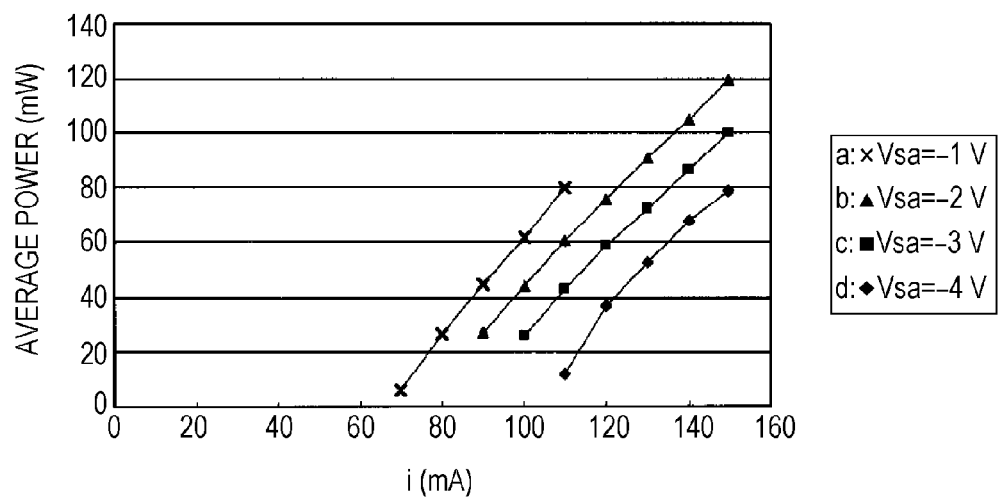
FIG. 3B is a graph illustrating a relationship between a gain current of the self oscillation semiconductor laser and an average power of the oscillated laser light.

FIG. 3B is a graph illustrating an average power of laser light oscillated when a current applied to the gain section 116 varies at a constant bias voltage applied to the saturable absorber section 117, in the self oscillation semiconductor laser 1.

The transverse axis expresses a current amount to be injected to the gain section 116, and the longitudinal axis expresses an average power of the oscillated laser light.

In addition, the symbol a denotes a case where the bias voltage is −1V, and the symbol b denotes a case where the bias voltage is −2V. Also, the symbol c denotes a case where the bias voltage is −3V, and the symbol d denotes a case where the bias voltage is −4V.

It can be seen from FIG. 3B that as the current amount to be injected into the gain section 116 increases, the average power of the laser light also increases. Further, if a current is constant, the average power of the laser light decreases as the value of the bias voltage increases in a negative direction.

Figure 4:
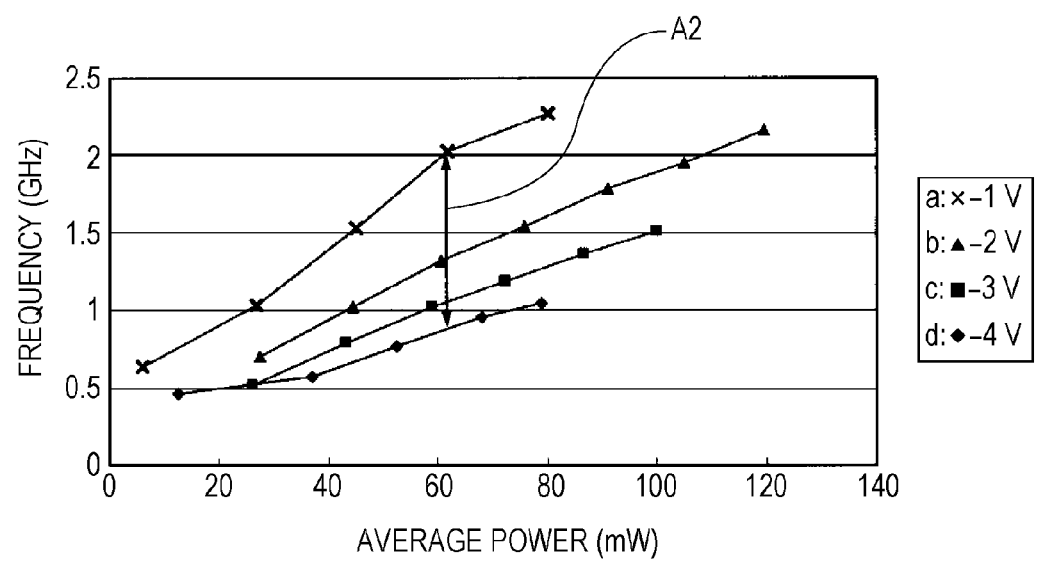
FIG. 4 is a graph illustrating a relationship between an average power of the laser light oscillated from the self oscillation semiconductor laser and the pulsed light frequency.

FIG. 4 is a graph illustrating a relationship between the average power of the oscillated laser light and the pulsed light frequency, which is obtained from the results shown in FIGS. 3A and 3B.

The transverse axis expresses the average power of the oscillated laser light, and the longitudinal axis expresses the pulsed light frequency.

In addition, the symbol a denotes a case where the bias voltage is −1V, and the symbol b denotes a case where the bias voltage is −2V. Also, the symbol c denotes a case where the bias voltage is −3V, and the symbol d denotes a case where the bias voltage is −4V.

From this, it can be seen that the pulsed light frequency can vary through the variation in the bias voltage when the average power of the laser light is constant, for example, as marked with the arrow A2.

The variation in the bias voltage alters the average power of the laser light as shown in FIG. 3B. However, the average power of the laser light can vary through the variation in the current amount to be injected into the gain section 116. In other words, by adjusting the current amount to be injected, it is possible to negate the variation in the average power of the laser light caused by the variation in the bias voltage. Therefore, the control is performed such that the average power of the laser light is made constant and the pulsed light frequency varies. Likewise, if a control target value of the average power is corrected according to the increase in the number of pulses per unit time caused by the variation in the frequency, a peak power can be made constant.

This embodiment realizes such an operation of the self oscillation semiconductor laser 1.

Referring to FIG. 1 again, in the light oscillation device 100 according to this embodiment, the variable voltage source 7 is connected to the saturable absorber section 117 of the self oscillation semiconductor laser 1, and applies a negative bias voltage to the saturable absorber section 117. In addition, the lower electrode of the self oscillation semiconductor laser 1 is grounded.

The gain section 116 of the self oscillation semiconductor laser 1 is connected to the current control circuit 6 such as, for example, an APC (auto power control) circuit, and is applied with a current from the current control circuit 6.

In a state where a negative bias voltage is applied to the saturable absorber section 117 of the self oscillation semiconductor laser 1, laser light is emitted by injecting a current into the gain section 116 of the self oscillation semiconductor laser 1. In the light oscillation device 100 according to this embodiment, it is possible to control the frequency of the emitted laser light through the variation in a voltage from the variable voltage source 7.

The laser light emitted from the self oscillation semiconductor laser 1 is collimated by, for example, the collimator lens 2 and is incident on the light separation unit 3. A portion of the incident laser light beams are separated in the light separation unit 3, and the separated light beams are sensed by the light sensing element 5.

If necessary, the laser light may be collected on the light sensing element 5 via the collecting lens 4.

The light separation unit 3 may use, for example, a beam splitter. In addition, the light sensing element 5 may use, for example, a photodiode or the like.

The APC circuit 6 controls an amount of a forward current to be injected into the gain section 116 of the self oscillation semiconductor laser 1 based on an amount of light to be sensed by the light sensing element 5. Thereby, it is possible to control the intensity of the laser light emitted from the self oscillation semiconductor laser 1 to be constant.

In this way, in the light oscillation device 100 according to this embodiment, it is possible to control the pulsed light frequency of the laser light oscillated by the applied voltage, and, In other words, it is possible to realize a function as light VCO.

Therefore, it is not necessary to design and manufacture a semiconductor laser for each pulsed light frequency which is necessary according to its use. Further, the external modulator is not necessary unlike in the related art, and thus it is possible to greatly reduce costs.

In addition, since the pulsed light frequency can be controlled by the voltage signal, it is possible for the light oscillation device to be used to generate the master clocks in an optical circuit through being embedded in an electronic circuit. Therefore, it is possible to further realize the practical use of the optical circuit.

2. Second Embodiment

Here, a case of applying the light oscillation device described in the first embodiment (FIG. 1) to a recording device as an example of its use will be described. Also, hereinafter, the same reference numerals are given to the elements corresponding to those in FIG. 1, and the description of the overlapping parts will be omitted.

Figure 5:
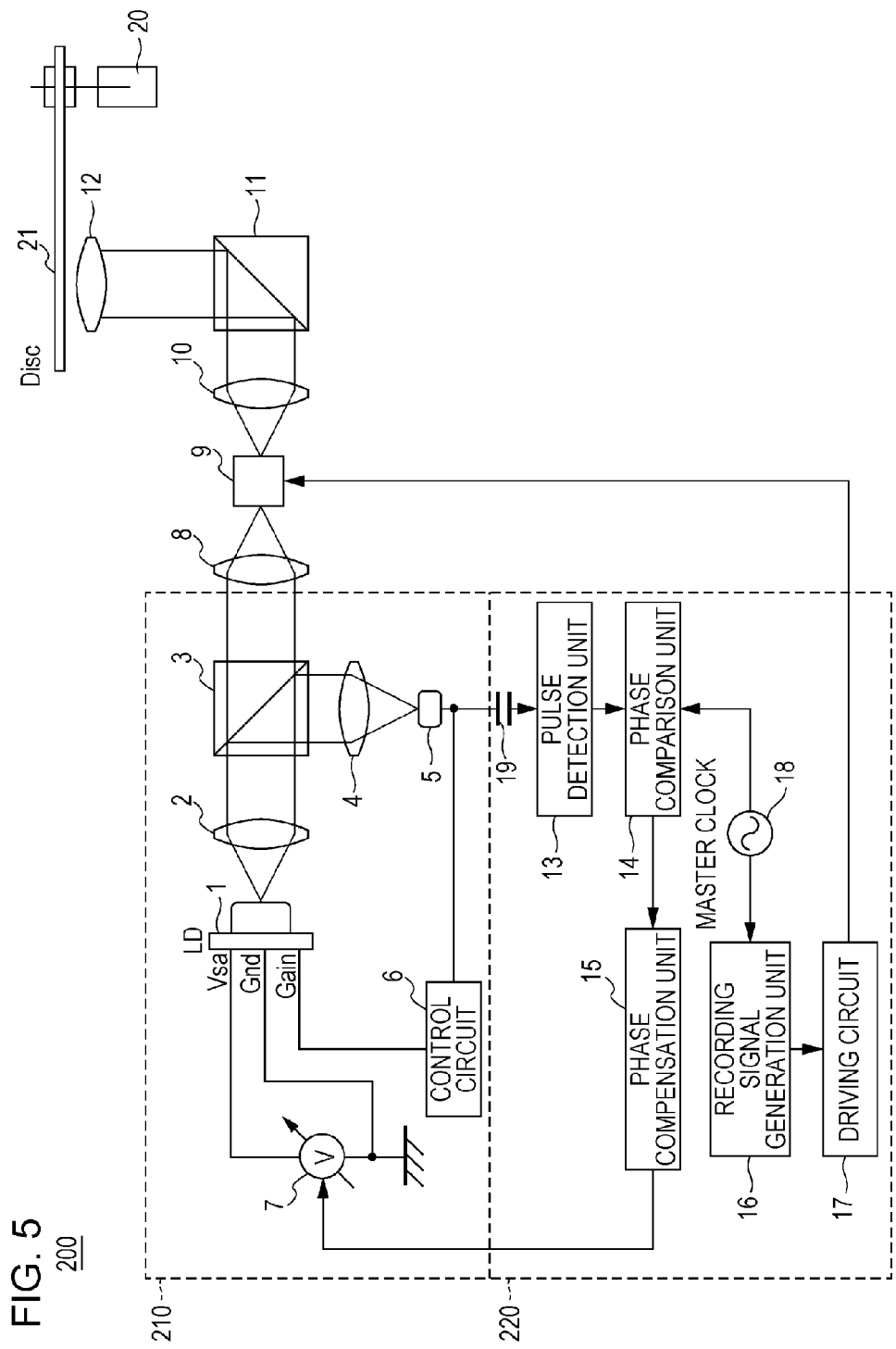
FIG. 5 is a schematic configuration diagram illustrating a recording device according to a second embodiment.

FIG. 5 is a schematic configuration diagram illustrating a recording device 200 according to the second embodiment.

The recording device 200 according to this embodiment includes a light oscillation device 210 which controls a pulsed light frequency of laser light using an applied voltage, and a collecting lens 8 which collects the laser light emitted from the light oscillation device 210.

The recording device 200 according to this embodiment also includes a light modulation unit 9 which modulates the laser light collected by the collecting lens 8, and a collimator lens 10 which collimates the laser light modulated by the light modulation unit 9.

In addition, the recording device 200 according to this embodiment includes a mirror 11 which changes light paths of the laser light collimated by the collimator lens 10, and an object lens 12 which collects the laser light, which changes its path due to the mirror 11, on an optical recording medium.

Further, the recording device 200 according to this embodiment includes a control unit 220 which controls the light oscillation device 210 and the light modulation unit 9 and controls the modulation of the laser light.

The light oscillation device 210 includes a self oscillation semiconductor laser 1 which emits laser light, a collimator lens 2 which collimates the light from the self oscillation semiconductor laser 1, and a light separation unit 3 which separates the light passing through the collimator lens 2.

Further, the light oscillation device 210 in this embodiment includes a collecting lens 4 which collects the light separated by the light separation unit 3, and a light sensing element 5 which senses the light collected by the collecting lens 4.

In addition, the light oscillation device 210 includes a current control circuit 6 which controls a current injected into the self oscillation semiconductor laser 1 based on the sensing amount of the light sensing element 5, and a variable voltage source 7 which applies a reverse bias voltage to the self oscillation semiconductor laser 1.

This light oscillation device 210 may use the light oscillation device 100 described in the first embodiment.

Therefore, the variable voltage source 7 is connected to the saturable absorber section 117 of the self oscillation semiconductor laser 1, and applies a negative bias voltage to the saturable absorber section 117. In addition, the lower electrode of the self oscillation semiconductor laser 1 is grounded, and the current control circuit 6 injects a current into the gain section 116.

In a state where a negative bias voltage is applied to the saturable absorber section 117 of the self oscillation semiconductor laser 1, the self oscillation semiconductor laser 1 continuously emits pulsed light by injecting a current into the gain section 116. At this time, it is possible to control the pulsed light frequency of the emitted laser light through the variation in a voltage which is applied to the saturable absorber section 117 from the variable voltage source 7.

The laser light emitted from the self oscillation semiconductor laser 1 is collimated by, for example, the collimator lens 2 and is incident on the light separation unit 3 such as, for example, a beam splitter. Most of the laser light beams pass through the light separation unit 3 and then are emitted from the light oscillation device 210.

Also, a portion of the incident laser light beams are separated by the light separation unit 3, and then enter the light sensing element 5 via the collecting lens 4.

The current control circuit 6 such as, for example, an APC circuit controls an amount of a current to be injected into the gain section 116 of the self oscillation semiconductor laser 1 based on an amount of laser light to be sensed by the light sensing element 5. Thereby, it is possible to control the intensity of the laser light emitted from the self oscillation semiconductor laser 1 to be constant.

In the light oscillation device 210 in this embodiment, it is possible to maintain the power of the emitted laser light to be constant through the control of the applied voltage and change the pulsed light frequency.

The laser light emitted from the light oscillation device 210 is collected on the light modulation unit 9 by the collecting lens 8. The light modulation unit 9 may use, for example, a semiconductor optical amplifier (SOA).

The semiconductor optical amplifier is a small-sized and low cost optical amplifier and is preferable as it is used as an optical gate or an optical switch which switches a light on and off. In this embodiment, the laser light from the self oscillation semiconductor laser 1 is modulated and recording data is carried on the laser light, through switching the optical amplifier on and off.

Figure 6:
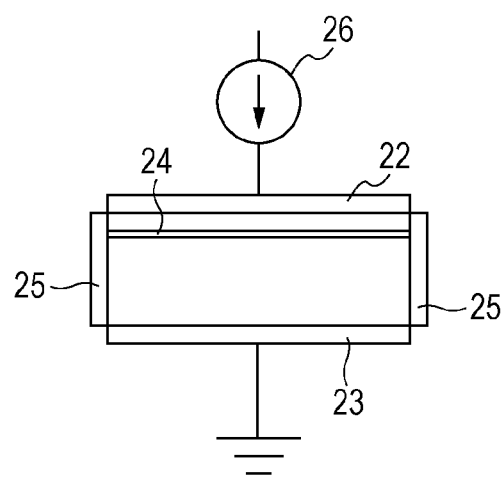
FIG. 6 is a schematic configuration diagram illustrating a semiconductor optical amplifier.

FIG. 6 is a schematic diagram illustrating a structure of the semiconductor optical amplifier. In a typical semiconductor laser, light is confined in a resonator including mirrors positioned at both end surfaces, and laser light is oscillated by an optical gain caused by transition between bands.

In contrast, in the semiconductor optical amplifier, the laser oscillation is suppressed by disposing anti-reflection films 25 at both the end surfaces instead of mirrors. In other words, the semiconductor optical amplifier works as a one pass amplifier.

A driving current is injected between an upper electrode 22 and a lower electrode 23 from a current source 26. In this state, if laser light enters incident end surfaces disposed at the anti-reflection films 25, the laser light is amplified due to the stimulated emission whilst traveling through the active layer 24.

In addition, it is possible to control an amount of the laser light to be amplified through the control of an amount of the driving current to be injected into the semiconductor optical amplifier.

However, it may not be necessary to amplify the incident light, and in a case where it is possible to obtain a sufficient laser light power, the gain of the semiconductor amplifier may be 1.

Figure 7A:
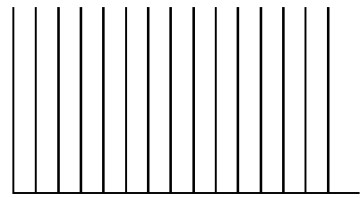
Figure 7B:
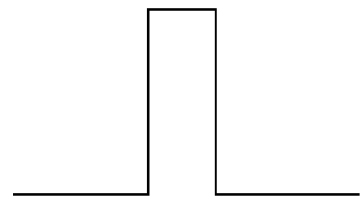
Figure 7C:
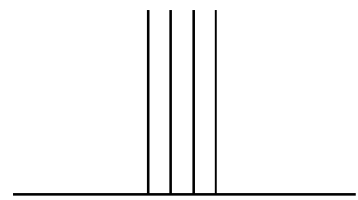

In this semiconductor optical amplifier, the lifetime of carriers is short, and a high speed response to variation in a current or a light intensity is shown. Therefore, for the consecutive pulses from the self oscillation semiconductor laser 1 shown in FIG. 7A, for example, if a driving current with the waveform shown in FIG. 7B is input from the electrode of the semiconductor amplifier, the pulsed light with the waveform shown in FIG. 7C is output from the semiconductor amplifier.

In other words, the semiconductor amplifier can be used as a high speed optical switch which can control switching the laser light on and off due to the signal of the driving current and which can treat the pulsed light frequency of the self oscillation semiconductor laser 1.

In this embodiment, the self oscillation semiconductor laser 1 emits laser light with the wavelength of, for example, 407 nm. Therefore, the active layer, the guide layer, the clad layer, and the like of the semiconductor optical amplifier used as the light modulation unit 9 are preferably made of the same materials as in a so-called blue-violet semiconductor laser, which emits light beams with the same wavelength.

Referring to FIG. 5 again, the laser light modulated by the light modulation unit 9 is collimated by the collimator lens 10 and enters the mirror 11. The laser light is reflected by the mirror 11, alters its light path, and enters the object lens 12.

The laser light which has entered the object lens 12 is collected on the optical recording medium 21. The optical recording medium 21 is rotated by a spindle motor 20. A focusing spot of the laser light is moved casually in the diameter direction of the optical recording medium 21 by a thread motor (not shown). Thereby, the recording information carried on the laser light by the light modulation unit 9 is recorded on the optical recording medium 21.

In this embodiment, the control unit 220 can synchronize the laser light emitted from the self oscillation semiconductor laser 1 with the driving current for switching the light modulation unit 9 on and off, that is, a modulation signal.

The control unit 220 includes a reference clock generation unit 18 which generates master clock signals, and a pulsed light detection unit 13 which detects pulsed light of the laser light emitted from the self oscillation semiconductor laser 1.

In addition, the control unit 220 includes a phase comparison unit 14 which obtains a phase difference between the master clock signals generated by the reference clock generation unit 18 and a phase of the pulsed light detected by the pulsed light detection unit 13.

Further, the control unit 220 includes a phase compensation unit 15 which controls an output voltage from the variable voltage source 7 based on the phase difference obtained by the phase comparison unit 14.

The control unit 220 also includes a recording signal generation unit 16 which generates recording signals in synchronization with the master clocks from the reference clock generation unit 18, and a driving circuit 17 which drives the light modulation unit 9 in synchronization with the recording signals.

The recording signal generation unit 16 generates the recording signals by carrying recording data in synchronization with the master clock signals generated by the reference clock generation unit 18.

Also, the driving circuit 17 inputs modulation signals such as, for example, current signals which drive the light modulation unit 9, to the light modulation unit 9, based on the generated recording signals. Thereby, in the light modulation unit 9, on and off switching completely synchronized with the master clock signals is performed, and the recording signals are carried on the laser light from the self oscillation semiconductor laser 1.

In addition, the pulsed light detection unit 13 is connected to the light sensing element 5 via, for example, a capacitor 19 or the like, and detects the pulsed light of the laser light sensed by the light sensing element 5.

The phase comparison unit 14 obtains a phase difference between the pulsed light detected by the pulsed light detection unit 13 and the master clock signals generated by the reference clock generation unit 18.

The phase compensation unit 15 controls an output voltage from the variable voltage source 7 based on the phase difference obtained by the phase comparison unit 14. Thereby, it is possible to change the pulsed light frequency of the laser light emitted from the self oscillation semiconductor laser 1.

In this embodiment, the phase compensation unit 15 controls the output voltage from the variable voltage source 7 such that the phase difference detected by the phase comparison unit 14 becomes 0 or close to 0.

That is to say, a loop control for the pulsed light frequency of the laser light from the self oscillation semiconductor laser 1 is performed such that the phase difference between the phase of the pulsed light emitted from the self oscillation semiconductor laser 1 and the modulation signal for on and off switching of the light modulation unit 9 decreases. For example, if the phase difference is relatively small, the magnitude of the output voltage from the variable voltage source 7 may be set depending on small and large values of the phase difference.

Thereby, it is possible to synchronize the pulsed light emitted from the self oscillation semiconductor laser 1 with the modulation signals or the recording signals for switching the light modulation unit 9 on and off and further with the master clock signals.

In this way, in the recording device 200 according to this embodiment, it is possible to control the frequency of the oscillated pulsed light due to the voltage by using the self oscillation semiconductor laser 1 described in the first embodiment (FIG. 1).

For this reason, it is possible to synchronize the master clock signals which are electric signals, or the recording signal or the modulation signal generated based on the master clock signals with the pulsed light emitted from the self oscillation semiconductor laser 1.

Therefore, the recording device 200 according to this embodiment can perform accurate recording of data.

In addition, here, the example is described in which the bias voltage applied to the saturable absorber section 117 of the self oscillation semiconductor laser 1 is controlled using the phase difference between the detected pulsed light frequency and the master clock signals. In addition, it is possible to control the bias voltage based on a frequency difference between the pulsed light frequency and the master clock signals or based on both of the frequency difference and the phase difference.

3. Third Embodiment

In the second embodiment, the pulsed light detection unit 13 detects the pulsed light from the self oscillation semiconductor laser 1 which is sensed by the light sensing element 5.

However, the pulsed light frequency emitted from the self oscillation semiconductor laser 1 is for example, about 1 GHz, which is very high, and, in some cases, it is difficult for the light sensing element 5 such as, for example, a photodiode and the pulsed light detection unit 13 to detect the pulsed light.

Therefore, in the third embodiment, a method is employed in which a leakage current of a photocurrent flowing in synchronization with the oscillation in the self oscillation semiconductor laser 1 is detected and a frequency is detected. The third embodiment will be described below with reference to FIG. 8.

Figure 8:
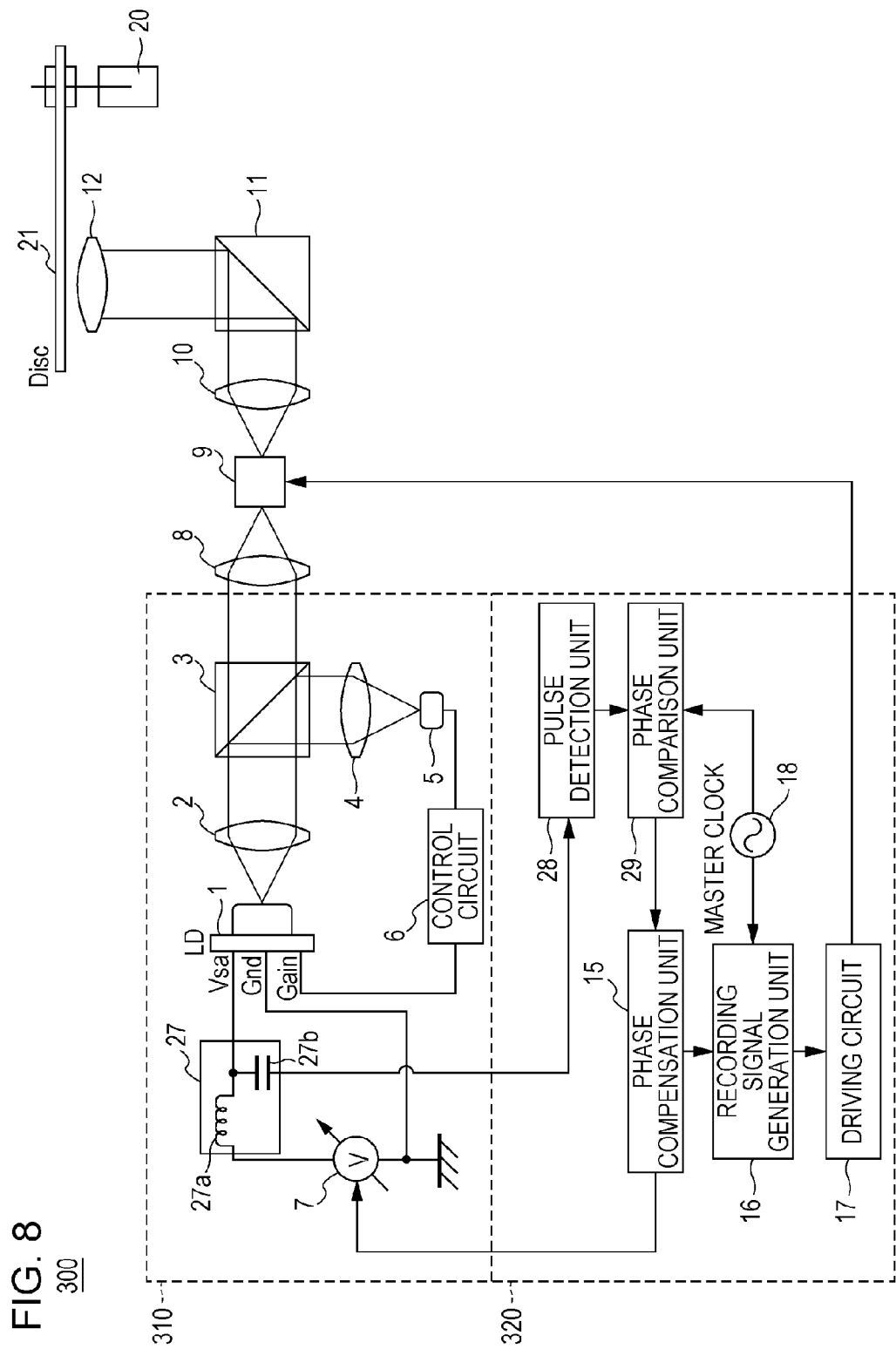
FIG. 8 is a schematic configuration diagram illustrating a recording device according to a third embodiment.

FIG. 8 is a schematic configuration diagram illustrating a recording device 300 according to the third embodiment. Hereinafter, the same reference numerals are given to the elements corresponding to those in the first embodiment (FIG. 1) and the second embodiment (FIG. 5), and the description of the overlapping parts will be omitted.

The recording device 300 according to this embodiment includes a light oscillation device 310 which controls a pulsed light frequency of laser light using an applied voltage, and a collecting lens 8 which collects the laser light emitted from the light oscillation device 310.

The recording device 300 according to this embodiment also includes a light modulation unit 9 which modulates the laser light collected by the collecting lens 8, and a collimator lens 10 which collimates the laser light modulated by the light modulation unit 9.

In addition, the recording device 300 according to this embodiment includes a mirror 11 which changes light paths of the laser light collimated by the collimator lens 10, and an object lens 12 which collects the laser light, which changes its path due to the mirror 11, on an optical recording medium.

Further, the recording device 300 according to this embodiment includes a control unit 320 which controls the light oscillation device 310 and the light modulation unit 9 and controls the modulation of the laser light.

The light oscillation device 310 includes a self oscillation semiconductor laser 1 which emits laser light based on the sensing amount of the light sensing element 5, a collimator lens 2 which collimates the light from the self oscillation semiconductor laser 1, and a light separation unit 3 which separates a portion of the light passing through the collimator lens 2.

Further, the light oscillation device 310 in this embodiment includes a collecting lens 4 which collects the light separated by the light separation unit 3, and a light sensing element 5 which senses the light collected by the collecting lens 4.

In addition, the light oscillation device 310 includes a current control circuit 6 which controls a current injected into the self oscillation semiconductor laser 1, and a variable voltage source 7 which applies a reverse bias voltage to the self oscillation semiconductor laser 1.

In this embodiment as well, this light oscillation device 310 may use the light oscillation device 100 described in the first embodiment (FIG. 1).

Therefore, the variable voltage source 7 is connected to the saturable absorber section 117 of the self oscillation semiconductor laser 1, and applies a negative bias voltage to the saturable absorber section 117. In addition, the lower electrode of the self oscillation semiconductor laser 1 is grounded, and the current control circuit 6 injects a current into the gain section 116.

In a state where a negative bias voltage is applied to the saturable absorber section 117 of the self oscillation semiconductor laser 1, the self oscillation semiconductor laser 1 continuously emits pulsed light by injecting a current into the gain section 116. At this time, it is possible to control the pulsed light frequency of the emitted laser light through the variation in a bias voltage which is applied to the saturable absorber section 117 from the variable voltage source 7.

The laser light emitted from the self oscillation semiconductor laser 1 is collimated by, for example, the collimator lens 2 and is incident on the light separation unit 3 such as, for example, a beam splitter. Only, most of the laser light beams pass through the light separation unit 3 and then are emitted from the light oscillation device 310.

Also, a portion of the incident laser light beams are separated by the light separation unit 3, and then enter the light sensing element 5 such as, for example, a photodiode, via the collecting lens 4.

The current control circuit 6 such as, for example, an APC circuit controls an amount of a current to be injected into the gain section 116 of the self oscillation semiconductor laser 1 based on an amount of laser light to be sensed by the light sensing element 5. Thereby, it is possible to control the intensity of the laser light emitted from the self oscillation semiconductor laser 1 to be constant.

In the light oscillation device 310 in this embodiment as well, it is possible to maintain the power of the emitted laser light to be constant through the control of the applied voltage and change the pulsed light frequency.

The laser light emitted from the light oscillation device 310 is collected on the light modulation unit 9 by the collecting lens 8. The light modulation unit 9 may use, for example, a semiconductor optical amplifier (SOA).

In this embodiment as well, the laser light from the self oscillation semiconductor laser 1 is modulated and recording information is carried on the laser light, through switching the optical amplifier on and off.

However, it may not be necessary to amplify the incident laser light, and in a case where it is possible to obtain a sufficient laser light power, the gain of the semiconductor amplifier may be 1.

In addition, the active layer, the guide layer, the clad layer, and the like of the semiconductor optical amplifier used as the light modulation unit 9 are preferably made of the same materials as in a so-called blue-violet semiconductor laser, which emits light beams with the same wavelength.

The laser light modulated by the light modulation unit 9 is collimated by the collimator lens 10 and enters the mirror 11. The laser light is reflected by the mirror 11, alters its light path, and enters the object lens 12.

The laser light which has entered the object lens 12 is collected on the optical recording medium 21. The optical recording medium 21 is rotated by a spindle motor 20. A focusing spot of the laser light is moved casually in the diameter direction of the optical recording medium 21 by a thread motor (not shown). Thereby, the recording information carried on the laser light by the light modulation unit 9 is recorded on the optical recording medium 21.

In this embodiment, a frequency separation end stage 27 such as, for example, an LC circuit, is connected between the self oscillation semiconductor laser 1 of the light oscillation device 310 and the variable voltage source 7 which applies a voltage to the saturable absorber section 117 of the self oscillation semiconductor laser 1.

The variable voltage source 7 applies a negative bias voltage to the saturable absorber section 117 of the self oscillation semiconductor laser 1, but a current slightly flows in synchronization with the oscillation in the self oscillation semiconductor laser 1. If an AC component of the leakage current of the photocurrent can be detected, it is possible to directly obtain the pulsed light frequency of the self oscillation semiconductor laser 1 as an electric signal.

In a case of using the LC circuit, for example, an AC component generated depending on a current flowing into a coil 27a is extracted using a capacitor 27b, and thus pulsed light can be detected.

Figure 9A:
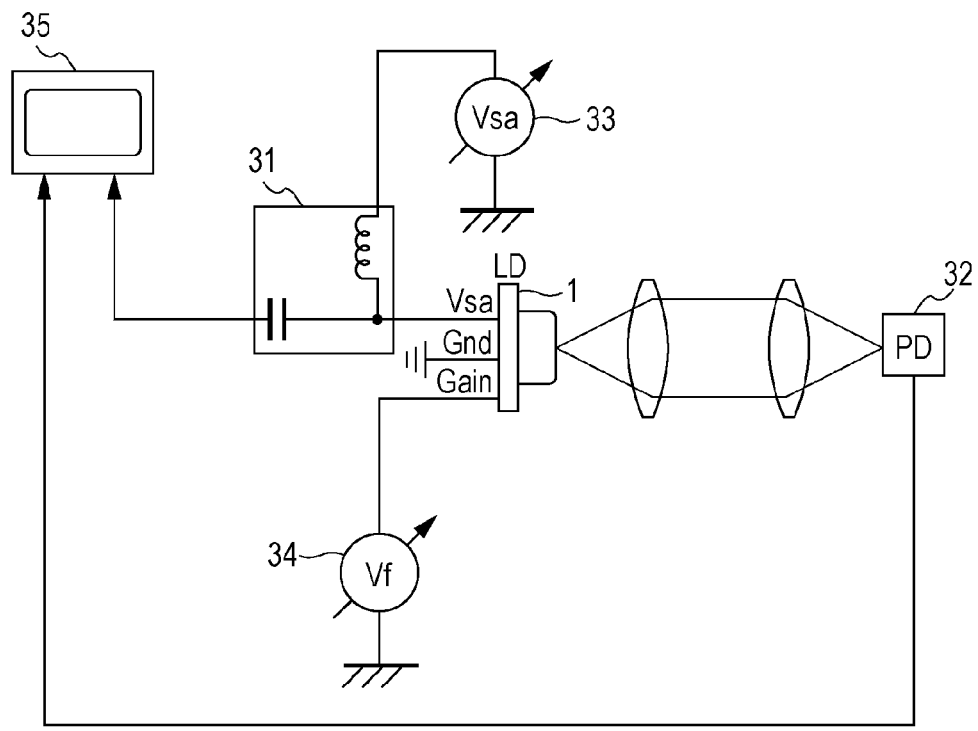
FIG. 9A is a schematic diagram illustrating detection test for a leakage current of a photocurrent of the self oscillation semiconductor laser.
Figure 9B:
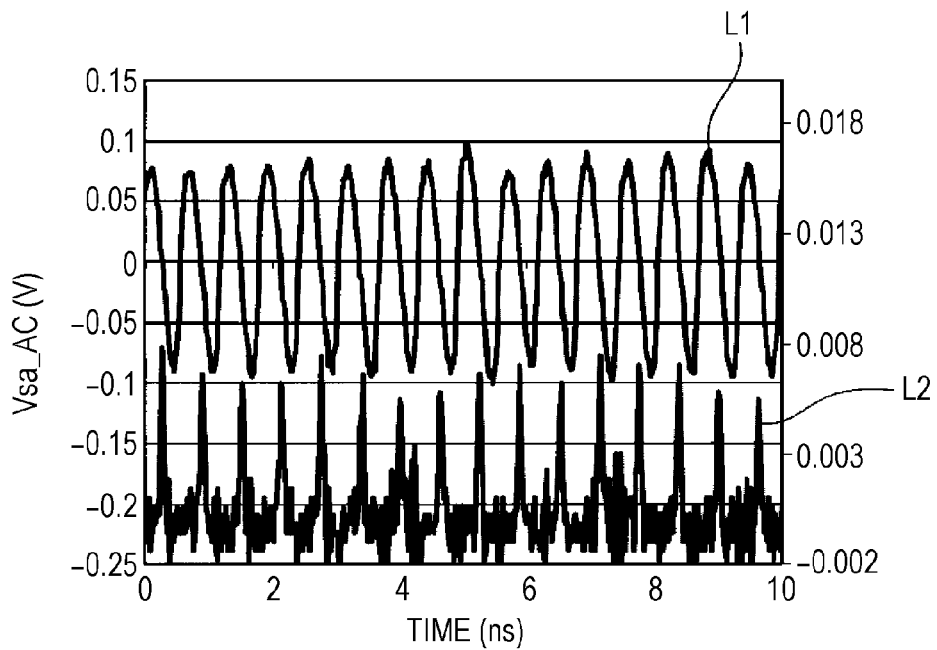
FIG. 9B is a diagram illustrating a detection waveform obtained by the test.
Figure 11A:
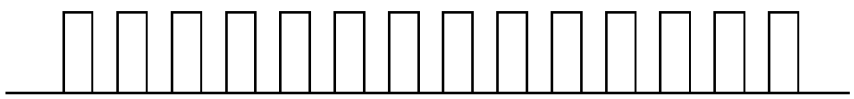
Figure 11B:
Figure 11C:
Figure 11D:
Figure 11E:
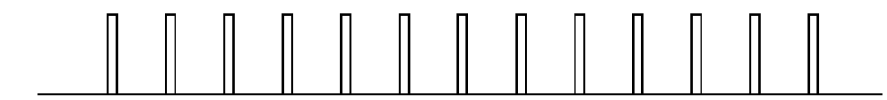
Figure 11F:
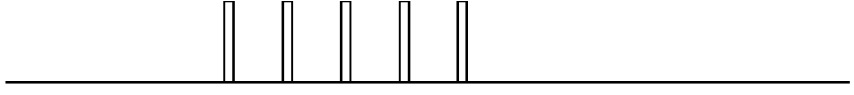

FIGS. 9A and 9B show a result of a test of detecting the pulsed light.

As shown in FIG. 9A, the saturable absorber section 117 of the self oscillation semiconductor laser 1 is connected to a variable voltage source 33 via an LC circuit 31 and is applied with a reverse bias voltage.

The gain section 116 of the self oscillation semiconductor laser 1 is connected to a variable AC voltage source 34, and a forward current is injected into the gain section 116 of the self oscillation semiconductor laser 1.

In addition, an oscilloscope 35 is connected to a voltage output terminal of the LC circuit 31, and a waveform of a detected voltage is measured. Further, a light emission waveform of the self oscillation semiconductor laser 1 detected by a high speed photodiode (1004, manufactured by Newport Corporation) 32 is output to the oscilloscope 35.

FIG. 9B shows the two waveforms detected by the oscilloscope 35. The transverse axis expresses time, and the longitudinal axis expresses a voltage. The line L1 indicates the AC component of the leakage current of the photocurrent, according to the bias voltage applied to the saturable absorber section 117 of the self oscillation semiconductor laser 1, which is detected by the LC circuit 31. In addition, the line L2 indicates the light emission waveform of the self oscillation semiconductor laser 1, which is detected by the high speed photodiode 32 and photoelectric-converted.

As shown in the light emission waveform indicated by the line L2, it can be ascertained that the pulsed light from the self oscillation semiconductor laser 1 can be detected by the high speed photodiode 32 since peaks periodically arranged are seen. In addition, as shown in the line L1, the AC component detected by the LC circuit 31 is synchronized with the peaks indicated by the line L2. From this, it can be ascertained that the pulsed light from the self oscillation semiconductor laser 1 can be reliably detected by the LC circuit 31.

In addition, by detecting the leakage current of the photocurrent in this way, it is possible to detect each pulsed laser light which a pulsed light frequency which appears to exceed the sensitivity of the light sensing element 5 such as the photodiode.

The control unit 320 includes a reference clock generation unit 18 which generates master clock signals, and a frequency detection unit 28 which detects a pulsed light frequency of the laser light emitted from the self oscillation semiconductor laser 1.

The control unit 320 includes a frequency comparison unit 29 which obtains a frequency difference between a frequency of the master clock signals generated by the reference clock generation unit 18 and a frequency of the pulsed light frequency detected by the frequency detection unit 28.

The control unit 320 includes a compensation unit 15 which controls an output voltage from the variable voltage source 7 based on the frequency difference obtained by the frequency comparison unit 29.

The control unit 320 also includes a recording signal generation unit 16 which generates recording signals in synchronization with the master clock signals from the reference clock generation unit 18, and a driving circuit 17 which drives the light modulation unit 9 in synchronization with the recording signals.

The recording signal generation unit 16 generates the recording signals based on the master clock signals generated by the reference clock generation unit 18.

Also, the driving circuit 17 inputs modulation signals such as, for example, current signals which drive the light modulation unit 9, to the light modulation unit 9, based on the generated recording signals. Thereby, in the light modulation unit 9, on and off switching completely synchronized with the master clock signals and the recording signals is performed.

The frequency detection unit 28 obtains the pulsed light frequency of the self oscillation semiconductor laser 1 by detecting a frequency of a signal output from the current detection unit 27.

The frequency comparison unit 29 obtains a frequency difference between a frequency of the self oscillation semiconductor laser 1 detected by the frequency detection unit 28 and a frequency of the master clock signals generated by the reference clock generation unit 18.

The compensation unit 15 controls the variable voltage source 7 based on the frequency difference obtained by the frequency comparison unit 29 and controls a bias voltage applied to the saturable absorber section 117 of the self oscillation semiconductor laser 1. Therefore, it is possible to control the pulsed light frequency of the laser light emitted from the self oscillation semiconductor laser 1.

In this embodiment, the compensation unit 15 performs the loop-control for the output voltage from the variable voltage source 7 such that the frequency difference decreases or becomes 0. Thereby, it is possible to synchronize the pulsed light frequency of the laser light emitted from the self oscillation semiconductor laser 1 with the frequency of the modulation signals or the recording signals driving the light modulation unit 9, and the master clock signals.

Thus, it is possible to reliably synchronize the pulsed light emitted from the self oscillation semiconductor laser 1 with the switching by the light modulation unit 9. Accordingly, the recording device according to this embodiment can perform accurate recording of data.

4. Fourth Embodiment

In the third embodiment, the pulsed light and the master clock signals are synchronized with each other by correcting the frequency of the pulsed light with respect to the master clock signals.

In order to perform further reliable synchronization, it is preferable to perform the correction of the phase and the frequency by halves. Here, this case will be described with reference to FIG. 10.

FIG. 10 is a schematic configuration diagram illustrating a recording device according to the fourth embodiment.

The recording device 400 according to this embodiment includes a light oscillation device 410 which controls a pulsed light frequency of laser light using an applied voltage, and a collecting lens 8 which collects the laser light emitted from the light oscillation device 410.

The recording device 400 according to this embodiment also includes a light modulation unit 9 which modulates the laser light collected by the collecting lens 8, and a collimator lens 10 which collimates the laser light modulated by the light modulation unit 9.

In addition, the recording device 400 according to this embodiment includes a mirror 11 which changes light paths of the laser light collimated by the collimator lens 10, and an object lens 12 which collects the laser light, which changes its path due to the mirror 11, on an optical recording medium.

Further, the recording device 400 according to this embodiment includes a control unit 420 which controls the light oscillation device 410 and the light modulation unit 9 and controls the modulation of the laser light.

The light oscillation device 410 includes a self oscillation semiconductor laser 1 which emits laser light, a collimator lens 2 which collimates the light from the self oscillation semiconductor laser 1, and a light separation unit 3 which separates a portion of the light passing through the collimator lens 2.

Further, the light oscillation device 410 in this embodiment includes a collecting lens 4 which collects the light separated by the light separation unit 3, and a light sensing element 5 which senses the light collected by the collecting lens 4.

In addition, the light oscillation device 410 includes a current control circuit 6 which controls a current injected into the self oscillation semiconductor laser 1, and a variable voltage source 7 which applies a reverse bias voltage to the self oscillation semiconductor laser 1.

In this embodiment as well, this light oscillation device 410 may use the light oscillation device 100 described in the first embodiment (FIG. 1).

Therefore, the variable voltage source 7 is connected to the saturable absorber section 117 of the self oscillation semiconductor laser 1, and applies a negative bias voltage to the saturable absorber section 117. In addition, the lower electrode of the self oscillation semiconductor laser 1 is grounded, and the current control circuit 6 injects a current into the gain section 116.

In a state where a negative bias voltage is applied to the saturable absorber section 117 of the self oscillation semiconductor laser 1, the self oscillation semiconductor laser 1 continuously emits pulsed light by injecting a current into the gain section 116. At this time, it is possible to control the pulsed light frequency of the emitted laser light through the variation in a bias voltage which is applied to the saturable absorber section 117 from the variable voltage source 7.

The laser light emitted from the self oscillation semiconductor laser 1 is collimated by, for example, the collimator lens 2 and is incident on the light separation unit 3 such as, for example, a beam splitter. Only, most of the laser light beams pass through the light separation unit 3 and then are emitted from the light oscillation device 410.

Also, a portion of the incident laser light beams are separated by the light separation unit 3, and then enter the light sensing element 5 such as, for example, a photodiode, via the collecting lens 4.

The current control circuit 6 such as, for example, an APC circuit controls an amount of a current to be injected into the gain section 116 of the self oscillation semiconductor laser 1 based on an amount of laser light to be sensed by the light sensing element 5. Thereby, it is possible to control the intensity of the laser light emitted from the self oscillation semiconductor laser 1 to be constant.

In the light oscillation device 410 in this embodiment as well, it is possible to maintain the power of the emitted laser light to be constant through the control of the applied voltage and change the pulsed light frequency.

The laser light emitted from the light oscillation device 410 is collected on the light modulation unit 9 by the collecting lens 8. The light modulation unit 9 may use, for example, a semiconductor optical amplifier (SOA).

In this embodiment as well, the laser light from the self oscillation semiconductor laser 1 is modulated and recording information is carried on the laser light, through switching the optical amplifier on and off.

However, it may not be necessary to amplify the incident laser light, and in a case where it is possible to obtain a sufficient laser light power, the gain of the semiconductor amplifier may be 1.

In addition, the active layer, the guide layer, the clad layer, and the like of the semiconductor optical amplifier used as the light modulation unit 9 are preferably made of the same materials as in a so-called blue-violet semiconductor laser, which emits light beams with the same wavelength.

The laser light modulated by the light modulation unit 9 is collimated by the collimator lens 10 and enters the mirror 11. The laser light is reflected by the mirror 11, alters its light path, and enters the object lens 12.

The laser light which has entered the object lens 12 is collected on the optical recording medium 21. The optical recording medium 21 is rotated by a spindle motor 20. A focusing spot of the laser light is moved casually in the diameter direction of the optical recording medium 21 by a thread motor (not shown) through, for example, sliding of the light oscillation device 410. Thereby, the recording information carried on the laser light by the light modulation unit 9 is recorded on the optical recording medium 21.

In this embodiment as well, a current detection unit 27 such as, for example, a vice t, is connected between the self oscillation semiconductor laser 1 of the light oscillation device 410 and the variable voltage source 7 which applies a voltage to the saturable absorber section 117 of the self oscillation semiconductor laser 1.

It is possible to detect the pulsed light from the self oscillation semiconductor laser 1 by detecting the leakage current of the photocurrent according to the oscillation of the self oscillation semiconductor laser 1 using the current detection unit 27.

In addition, it is possible to detect each pulsed laser light of a pulsed light frequency which appears to exceed the sensitivity of the light sensing element 5 such as the photodiode.

The control unit 420 includes a reference clock generation unit 18 which generates master clock signals, and a pulse detection unit 13 which detects pulsed light of the laser light emitted from the self oscillation semiconductor laser 1.

In addition, the control unit 420 includes a frequency detection unit 28 which detects a pulsed light frequency of the laser light emitted from the self oscillation semiconductor laser 1.

The control unit 420 includes a frequency comparison unit 29 which obtains a frequency difference between a frequency of the master clock signals generated by the reference clock generation unit 18 and a frequency of the pulsed light frequency detected by the frequency detection unit 28.

In addition, the control unit 420 includes a phase comparison unit 14 which detects a phase difference between the master clock signals generated by the reference clock generation unit 18 and the pulsed light detected by the pulse detection unit 13.

Further, the control unit 420 includes a compensation unit 15 which controls an output voltage from the variable voltage source 7 based on the phase difference obtained by the phase comparison unit 14 and the frequency difference obtained by the frequency comparison unit 29.

The control unit 420 also includes a recording signal generation unit 16 which generates recording signals in synchronization with the master clocks from the reference clock generation unit 18, and a driving circuit 17 which drives the light modulation unit 9 in synchronization with the recording signals.

The recording signal generation unit 16 generates the recording signals based on the master clocks generated by the reference clock generation unit 18.

Also, the driving circuit 17 inputs modulation signals such as, for example, current signals which drive the light modulation unit 9, to the light modulation unit 9, based on the generated recording signals. Thereby, in the light modulation unit 9, on and off switching completely synchronized with the master clock signals and the recording signals is performed.

The frequency detection unit 28 obtains the pulsed light frequency of the self oscillation semiconductor laser 1 by detecting a frequency of a voltage signal output from the current detection unit 27.

The frequency comparison unit 29 obtains a frequency difference between a frequency of the self oscillation semiconductor laser 1 detected by the frequency detection unit 28 and a frequency of the master clock signals generated by the reference clock generation unit 18.

The pulse detection unit 13 is connected to the light sensing element 5 via, for example, a capacitor 19 or the like, and detects the pulsed light of the self oscillation semiconductor laser 1 sensed by the light sensing element 5.

The phase comparison unit 14 obtains a phase difference between the pulsed light detected by the pulse detection unit 13 and the master clock signals generated by the reference clock generation unit 18.

In this embodiment, the compensation unit 15 controls the variable voltage source 7 by using both of the phase difference obtained by the phase comparison unit 14 and the frequency difference obtained by the frequency comparison unit 29.

In other words, the loop-control is performed for the output voltage from the variable voltage source 7 such that both of the phase difference and the frequency difference decrease or become 0, and the pulsed light frequency of the laser light emitted from the self oscillation semiconductor laser 1 vary.

Thereby, it is possible to synchronize the light blocking film of the laser light emitted from the self oscillation semiconductor laser 1 with the frequency of the modulation signals, the recording signals which drive the light modulation unit 9, and the master clock signals.

Thus, it is possible to reliably synchronize the pulsed light emitted from the self oscillation semiconductor laser 1 with the switching by the light modulation unit 9. Accordingly, the recording device according to this embodiment can perform accurate recording of data.

As such, the light oscillation device and the recording device according to the embodiments of the present application have been described.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:
1. A light oscillation device comprising:
a self oscillation semiconductor laser that has a double quantum well separated confinement heterostructure made of GaInN/GaN/AlGaN materials and that includes a saturable absorber section which is applied with a negative bias voltage and a gain section into which a gain current is injected, wherein a p type GaInN guide layer, a p type AlGaN clad layer, a p type AlGaN barrier layer, and a p type GaN/AlGaN superlattice clad layer are sequentially formed in the self oscillation semiconductor laser;

a light separation means for separating a portion of laser light beams from the self oscillation semiconductor laser;

a light sensing element that senses the laser light beams separated by the light separation means; and a current control circuit which controls a current injected into the gain section of the self oscillation semiconductor laser based on an amount of the laser light beams which are sensed by the light sensing element.

2. The light oscillation device according to claim 1, wherein the oscillation semiconductor laser further comprises an insulating layer formed on the p type GaN/AlGaN superlattice clad layer.

3. The light oscillation device according to claim 2, wherein an n type GaN guide layer, an n type AlGaN clad layer, and an n type GaN type layer are sequentially formed under the active layer of the self oscillation semiconductor laser from an upper layer.

4. The light oscillation device according to claim 1, wherein the current control circuit controls the current injected into the gain section of the self oscillation semiconductor laser based on the sensed laser light beams to maintain an intensity of the laser light beams emitted from the self oscillation semiconductor laser at an at least substantially constant level.

5. A recording device comprising:

a light oscillation device having a self oscillation semiconductor laser that has a double quantum well separated confinement heterostructure made of GaInN/GaN/AlGaN materials and that includes a saturable absorber section which is applied with a negative bias voltage and a gain section into which a gain current is injected, wherein a p type GaInN guide layer, a p type AlGaN clad layer, a p type AlGaN barrier layer, and a p type GaN/AlGaN superlattice clad layer are sequentially formed in the self oscillation semiconductor laser; a light separation means for separating a portion of laser light beams from the self oscillation semiconductor laser; a light sensing element that senses the laser light beams separated by the light separation means; and a current control circuit which controls a current injected into the gain section of the self oscillation semiconductor laser based on an amount of the laser light beams which are sensed by the light sensing element;

a light modulation means for modulating the laser light emitted from a collecting lens which collects the laser light emitted from the light separation means of the light oscillation device;

an object lens that collects the laser light modulated by the light modulation means on a recording medium;

a reference signal generation unit that generates master clock signals;

a recording signal generation unit that generates recording signals based on the master clock signals;

a driving circuit that drives the light modulation means based on the recording signals;

a pulse detection means for detecting pulsed light of the laser light sensed by the light sensing element;

a phase comparison means for detecting a phase difference between the pulsed light and the master clock signals; and a compensation means for controlling a voltage applied to the saturable absorber section of the self oscillation semiconductor laser based on the phase difference detected by the phase comparison means.

6. The recording device according to claim 5, wherein the compensation means controls the voltage applied to the saturable absorber section of the self oscillation semiconductor laser such that the phase difference decreases.

7. The recording device according to claim 6, wherein the light modulation means is a semiconductor optical amplifier.

8. The recording device according to claim 5, wherein the current control circuit controls the current injected into the gain section of the self oscillation semiconductor laser based on the sensed laser light beams to maintain an intensity of the laser light beams emitted from the self oscillation semiconductor laser at an at least substantially constant level.

9. A recording device comprising:

a light oscillation device having a self oscillation semiconductor laser that has a double quantum well separated confinement heterostructure made of GaInN/GaN/AlGaN materials and that includes a saturable absorber section which is applied with a negative bias voltage and a gain section into which a gain current is injected, wherein a p type GaInN guide layer, a p type AlGaN clad layer, a p type AlGaN barrier layer, and a p type GaN/AlGaN superlattice clad layer are sequentially formed in the self oscillation semiconductor laser; a light separation unit that separates a portion of laser light beams from the self oscillation semiconductor laser; a light sensing element that senses the laser light beams separated by the light separation unit; and a current control circuit which controls a current injected into the gain section of the self oscillation semiconductor laser based on an amount of the laser light beams which are sensed by the light sensing element;

a light modulation unit that modulates the laser light emitted from a collecting lens which collects the laser light emitted from the light separation means of the light oscillation device;

an object lens that collects the laser light modulated by the light modulation unit on a recording medium;

a reference signal generation unit that generates master clock signals;

a recording signal generation unit that generates recording signals based on the master clock signals;

a driving circuit that drives the light modulation unit based on the recording signals;

a pulse detection unit that detects pulsed light of the laser light sensed by the light sensing element;

a phase comparison unit that detects a phase difference between the pulsed light and the master clock signals; and a compensation unit that controls a voltage applied to the saturable absorber section of the self oscillation semiconductor laser based on the phase difference detected by the phase comparison unit.

10. The recording device according to claim 9, wherein the current control circuit controls the current injected into the gain section of the self oscillation semiconductor laser based on the sensed laser light beams to maintain an intensity of the laser light beams emitted from the self oscillation semiconductor laser at an at least substantially constant level.

* * * * *